US011839026B2

(12) United States Patent
Wang et al.

(10) Patent No.: US 11,839,026 B2
(45) Date of Patent: Dec. 5, 2023

(54) CIRCUIT BOARD ASSEMBLY, DISPLAY APPARATUS, TERMINAL, AND SIGNAL PROCESSING SYSTEM

(71) Applicants: Chengdu BOE Optoelectronics Technology Co., Ltd., Sichuan (CN); BOE Technology Group Co., Ltd., Beijing (CN)

(72) Inventors: Zhongjie Wang, Beijing (CN); Fan Peng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 17/629,792

(22) PCT Filed: Mar. 11, 2021

(86) PCT No.: PCT/CN2021/080271
§ 371 (c)(1),
(2) Date: Jan. 25, 2022

(87) PCT Pub. No.: WO2021/218433
PCT Pub. Date: Nov. 4, 2021

(65) Prior Publication Data
US 2022/0256703 A1      Aug. 11, 2022

(30) Foreign Application Priority Data
Apr. 30, 2020   (CN) .......................... 202010366326.1

(51) Int. Cl.
*H05K 1/14* (2006.01)
*G09G 3/3225* (2016.01)

(52) U.S. Cl.
CPC ........... *H05K 1/141* (2013.01); *G09G 3/3225* (2013.01); *H05K 1/148* (2013.01); *H05K 2201/10318* (2013.01)

(58) Field of Classification Search
CPC ................... H05K 1/141; H05K 1/148; H05K 2201/10318; H05K 1/028–0283;
(Continued)

(56) References Cited

U.S. PATENT DOCUMENTS

| 5,027,088 A | 6/1991 | Shimizu et al. |
| 9,699,900 B2 | 7/2017 | Park |

(Continued)

FOREIGN PATENT DOCUMENTS

| CN | 1972256 A | 5/2007 |
| CN | 101398990 A | 4/2009 |

(Continued)

OTHER PUBLICATIONS

International Search Report for PCT/CN2021/080271 dated Jun. 23, 2021.

(Continued)

*Primary Examiner* — Hang Lin
(74) *Attorney, Agent, or Firm* — Ling Wu; Stephen Yang; Ling and Yang Intellectual Property

(57) ABSTRACT

Circuit board assembly, Display apparatus, Terminal, and Signal processing system. The circuit board assembly comprises a first circuit board, a second circuit board, a third circuit board, and multiple differential signal lines; the first circuit board comprises a first connector which comprises a first lead group comprising N first leads and a second lead group comprising N second lead; the second circuit board comprises a second connector which comprises a third lead group comprising N third leads and a fourth lead group comprising N fourth leads; multiple i-th leads and multiple (Continued)

US 11,839,026 B2

Page 2

(i+2)-th leads are in one-to-one correspondence, and the i-th leads and the corresponding (i+2)-th leads are arranged along a first direction; a first differential line of a j-th differential signal line is connected to the (2j−1)-th i-th lead and the (2j−1)-th (i+2)-th lead, its second differential line is connected to the 2j-th i-th lead and the 2j-th (i+2)-th lead.

18 Claims, 6 Drawing Sheets

(58) Field of Classification Search
CPC ........ H05K 1/118; H05K 1/147; H05K 1/189; H05K 3/326; H05K 3/361; H05K 2201/05; G09G 3/3225
See application file for complete search history.

(56) References Cited

U.S. PATENT DOCUMENTS

| | | |
|---|---|---|
| 10,127,855 B2 | 11/2018 | Zhang et al. |
| 2004/0119731 A1 | 6/2004 | Lee |
| 2006/0046569 A1 | 3/2006 | Kondou et al. |
| 2007/0071113 A1 | 3/2007 | Lee et al. |
| 2015/0011104 A1 | 1/2015 | Lee et al. |
| 2015/0085452 A1 | 3/2015 | Chou et al. |
| 2015/0323564 A1 | 11/2015 | Chu et al. |
| 2015/0380884 A1 | 12/2015 | Lee et al. |
| 2016/0088723 A1 | 3/2016 | Chung et al. |
| 2016/0143159 A1* | 5/2016 | Park ................ H05K 1/025 174/254 |
| 2016/0372059 A1 | 12/2016 | Liu |
| 2017/0271799 A1* | 9/2017 | Axelowitz ........... H01R 12/721 |
| 2018/0168042 A1* | 6/2018 | Hartman .............. H05K 3/4691 |
| 2019/0067844 A1* | 2/2019 | Go ........................ H05K 1/144 |
| 2019/0199025 A1 | 6/2019 | Kim |
| 2019/0281700 A1* | 9/2019 | Pyun ................... H05K 1/147 |
| 2020/0043399 A1 | 2/2020 | Chen |
| 2020/0411778 A1* | 12/2020 | Song ................... H05K 1/0281 |
| 2021/0037639 A1* | 2/2021 | Lee ..................... H05K 1/147 |
| 2021/0064103 A1 | 3/2021 | Zhang et al. |
| 2021/0410275 A1 | 12/2021 | An et al. |

FOREIGN PATENT DOCUMENTS

| | | |
|---|---|---|
| CN | 201845326 U | 5/2011 |
| CN | 103369822 A | 10/2013 |
| CN | 103983856 A | 8/2014 |
| CN | 104283066 A | 1/2015 |
| CN | 104599654 A | 5/2015 |
| CN | 105449463 A | 3/2016 |
| CN | 105590613 A | 5/2016 |
| CN | 107045861 A | 8/2017 |
| CN | 107301841 A | 10/2017 |
| CN | 108430153 A | 8/2018 |
| CN | 110021451 A | 7/2019 |
| CN | 110764639 A | 2/2020 |
| CN | 110995360 A | 4/2020 |
| CN | 111369945 A | 7/2020 |
| KR | 1020160093806 A | 8/2016 |

OTHER PUBLICATIONS

The First Office Action dated Nov. 18, 2020 for Chinese Patent Application No. 202010366326.1 and English Translation.

* cited by examiner

CIRCUIT BOARD ASSEMBLY, DISPLAY APPARATUS, TERMINAL, AND SIGNAL PROCESSING SYSTEM

CROSS-REFERENCE TO RELATED APPLICATIONS

The present application is a U.S. National Phase Entry of International Application No. PCT/CN2021/080271 having an international filing date of Mar. 3, 2021, which claims the priority of Chinese Patent Application No. 202010366326.1, filed to CNIPA on Apr. 30, 2020 and entitled "Circuit Board Assembly, Display Apparatus, Terminal and Signal Processing System". The above-identified applications are incorporated herein by reference in their entireties.

TECHNICAL FIELD

The present disclosure relates to, but is not limited to, the field of display technology, in particular to a circuit board assembly, a display apparatus, a terminal and a signal processing system.

BACKGROUND

Flexible Active Matrix Organic Light-Emitting Diode (AMOLED) display products have many advantages, such as self-illumination, no backlight, folding, wide viewing angle, high color gamut, fast response speed, high contrast, etc. It is a kind of display product that has received wide attention at present, among which AMOLED folding notebook is a common display product.

In order to ensure normal display, display products need to transmit high-speed differential signals through differential signal lines. However, the high-speed differential signals will have crosstalk or reflections due to discontinuous impedance on a path, which will reduce display effect of the display products.

SUMMARY

The following is a summary of the subject matters described in the present disclosure in detail. The summary is not intended to limit the scope of protection of the claims.

In a first aspect, the present disclosure provides a circuit board assembly, including: a first circuit board, a second circuit board, a third circuit board and multiple differential signal lines; wherein the first circuit board and the second circuit board are located at two opposite sides of the third circuit board respectively; and each differential signal line includes a first differential line and a second differential line.

The first circuit board includes: a first connector including a first pin group and a second pin group arranged along a first direction; the first pin group includes N first pins arranged along a second direction, and the second pin group includes N second pins arranged along the second direction.

The second circuit board includes: a second connector including a third pin group and a fourth pin group arranged along the first direction; the third pin group includes N third pins arranged along the second direction, and the fourth pin group includes N fourth pins arranged along the second direction.

Multiple i-th pins correspond to multiple (i+2)-th pins one by one, the i-th pins and corresponding (i+2)-th pins are arranged along the first direction, and i is a positive integer smaller than or equal to 2.

A first differential line of a j-th differential signal line is connected with a (2j−1)-th pin of the i-th pins and a (2j−1)-th pin of the (i+2)-th pins respectively, and a second differential line of the j-th differential signal line is connected with a 2j-th pin of the i-th pins and a 2j-th pin of the (i+2)-th pins respectively.

The first direction is an arrangement direction of the first circuit board and the second circuit board, and the second direction is perpendicular to the first direction, $1 \leq j \leq N/2$.

In some possible implementations, the first differential line and the second differential line of the same differential signal line have opposite polarities and have an equal width along the second direction.

In some possible implementations, the circuit board assembly further includes a ground line; the ground line is located between adjacent differential signal lines.

In some possible implementations, a k-th pin of the first pins is located between a k-th pin of the second pins and a (k+1)-th pin of the second pins, and an N-th pin of the second pins is located between an (N−1)-th pin of the first pins and an N-th pin of the first pins, $1 \leq k \leq N-1$.

In some possible implementations, a k-th pin of the second pins is located between a k-th pin of the first pins and a (k+1)-th pin of the first pins, and an N-th pin of the first pins is located between an (N−1)-th pin of the second pins and an N-th pin of the second pins; $1 \leq k \leq N-1$.

In some possible implementations, when i=1, a ground line between the j-th differential signal line and a (j+1)-th differential signal line is connected with a (2j+1)-th pin of the second pins and a (2j+1)-th pin of the fourth pins; and when i=2, a ground line between the j-th differential signal line and the (j+1)-th differential signal line is connected with a 2j-th pin of the first pins and a 2j-th pin of the third pins.

In some possible implementations, when i=1, a ground line between the j-th differential signal line and the (j+1)-th differential signal line is connected with a 2j-th pin of the second pins and a 2j-th pin of the fourth pins; and when i=2, a ground line between the j-th differential signal line and the (j+1)-th differential signal line is connected with a (2j+1)-th pin of the first pins and a (2j+1)-th pin of the third pins.

In some possible implementations, the first circuit board or the second circuit board is provided with a timing controller; the timing controller is connected with the differential signal lines, configured to convert a received display signal into a differential signal and send the differential signal to the differential signal lines.

In some possible implementations, a distance between the third circuit board and the first connector is greater than 0, and a distance between the third circuit board and the second connector is greater than 0.

In some possible implementations, the third circuit board is a flexible printed circuit board; the third circuit board is divided into a first connection part, a circuit board body and a second connection part which are arranged along the first direction; and the first connecting part is connected with the first circuit board, and the second connecting part is connected with the second circuit board.

In some possible implementations, the first connecting part is pressed on the first circuit board and the second connecting part is pressed on the second circuit board.

In a second aspect, the present disclosure further provides a display apparatus, including: a display panel and the circuit board assembly as described above; the first circuit board and the second circuit board in the circuit board assembly are connected with the display panel respectively.

In a third aspect, the present disclosure further provides a terminal, including: the display apparatus as described above.

In a fourth aspect, the present disclosure further provides a signal processing system, including: a client and the terminal as described above; the client is configured to send a display signal to the terminal; and the terminal is configured to convert the display signal into a differential signal.

In some possible implementations, the terminal includes: a timing controller provided on the circuit board assembly; and the timing controller is connected with the client and configured to convert the display signal sent by the client into the differential signal.

After reading and understanding the drawings and the detailed description, other aspects may be understood.

BRIEF DESCRIPTION OF DRAWINGS

The drawings are used to provide an understanding of technical solutions of the present disclosure, form a part of the specification, and are used to explain, together with the embodiments of the present disclosure, the technical solutions of the present disclosure but are not intended to form limitations on the technical solutions of the present disclosure.

DETAILED DESCRIPTION

Figure 1:
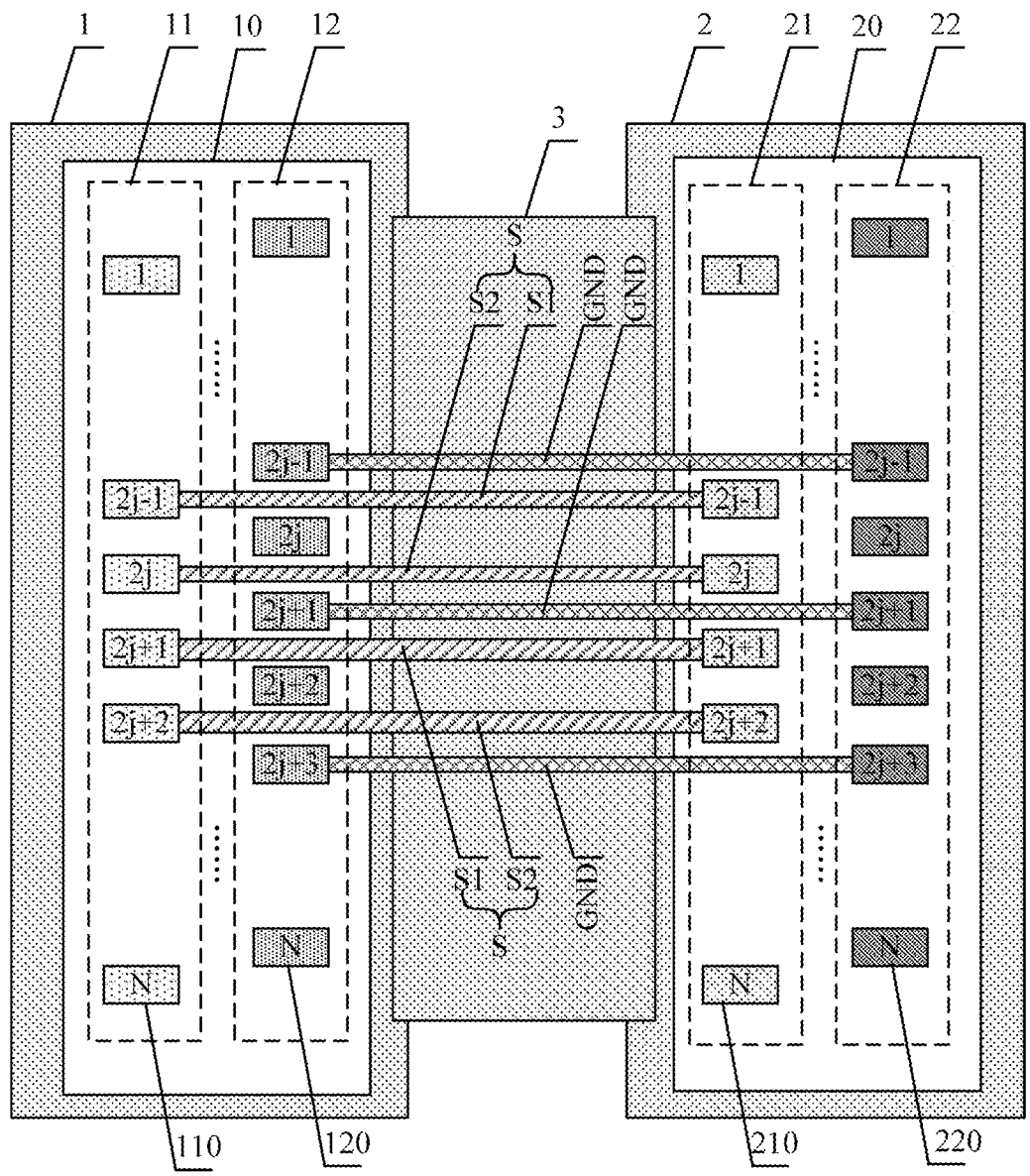
FIG. 1 is a first schematic diagram of a circuit board assembly according to an embodiment of the present disclosure.

The embodiments of the present disclosure will be described below in detail with reference to the accompanying drawings. The embodiments in the present disclosure and features in the embodiments can be combined with each other arbitrarily without conflict.

The present disclosure describes several embodiments, but the description is exemplary rather than restrictive, and those of ordinary skill in the art will recognize that more embodiments and implementation schemes are possible within the scope of the embodiments described in the present disclosure. Although many possible feature combinations are shown in the drawings and discussed in specific implementation modes, the disclosed features may also be combined in many other manners. Unless specifically restricted, any feature or element of any embodiment may be combined with any other feature or element in any other embodiment for use, or may take the place of any other feature or element in any other embodiment.

The present disclosure includes and conceives combinations of features and elements well known to those of ordinary skill in the art. The disclosed embodiments, features and elements of the present disclosure may be combined with any regular features or elements to form a technical solution defined by the claims. Any feature or element of any embodiment may also be combined with features or elements from another technical solution to form another technical solution defined by the claims. Therefore, it should be understood that any features shown and/or discussed in the present disclosure may be implemented individually or in any appropriate combination. Therefore, no other limits are made to the embodiments, besides limits made by the appended claims and equivalent replacements thereof. In addition, various modifications and variations may be made within the scope of protection of the appended claims.

Unless otherwise defined, technical terms or scientific terms used in the present disclosure shall have common meanings as construed by those of ordinary skills in the art to which the present disclosure pertains. "First", "second", and similar terms used in the disclosure do not represent any sequence, number, or significance but are only adopted to distinguish different components. The word "comprise" or "include", etc. means that an element or article that precedes the word is inclusive of the element or article listed after the word and equivalents thereof, but does not exclude other elements or articles. Wordings such as "connect" or "connected" are not limited to physical or mechanical connection, but may include electrical connection, whether direct or indirect. "Above", "below", "left", "right", and the like are only used to indicate relative position relationships. When the absolute position of the described object changes, the relative position relationship may also change accordingly.

An AMOLED folding notebook includes a left circuit board, a right circuit board and a flexible printed circuit board provided between the left circuit board and the right circuit board. The left circuit board and the right circuit board are provided with connection lines for connecting differential signal lines.

For the AMOLED folding notebook, many signals such as power supply, gate signals, differential display signals of a circuit board of one side of the AMOLED folding notebook must be bridged to a circuit board of the other side through an FPC. On the other hand, the AMOLED folding notebook has strict restrictions on the size of connectors. These two aspects determine together that only double-row pin connectors can be used on each circuit board, and a spacing between pins and a width of a pin are very small. This will cause two problems: first, differential signal lines cannot be routed symmetrically at the connector; second, because of an extremely small line width and pitch, the differential impedance of the differential signal lines can't be controlled according to a specification of 100 ohm on a flexible printed circuit board, which leads to discontinuity of the impedance of the differential signal lines on the path, aggravates the crosstalk and reflection of the differential signals, and seriously affects display quality of products.

Figure 2:
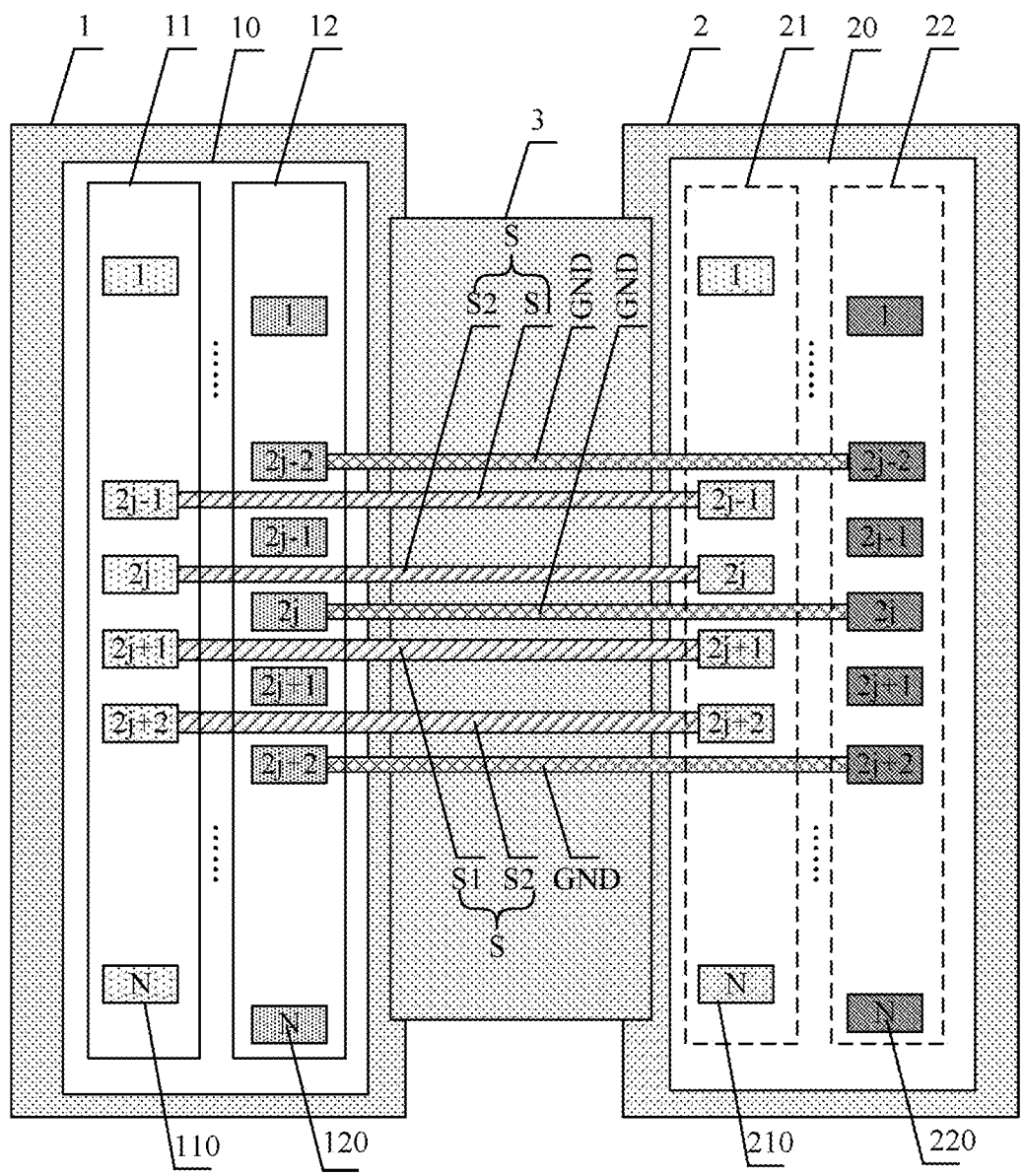
FIG. 2 is a second schematic diagram of a circuit board assembly according to an embodiment of the present disclosure.
Figure 3:
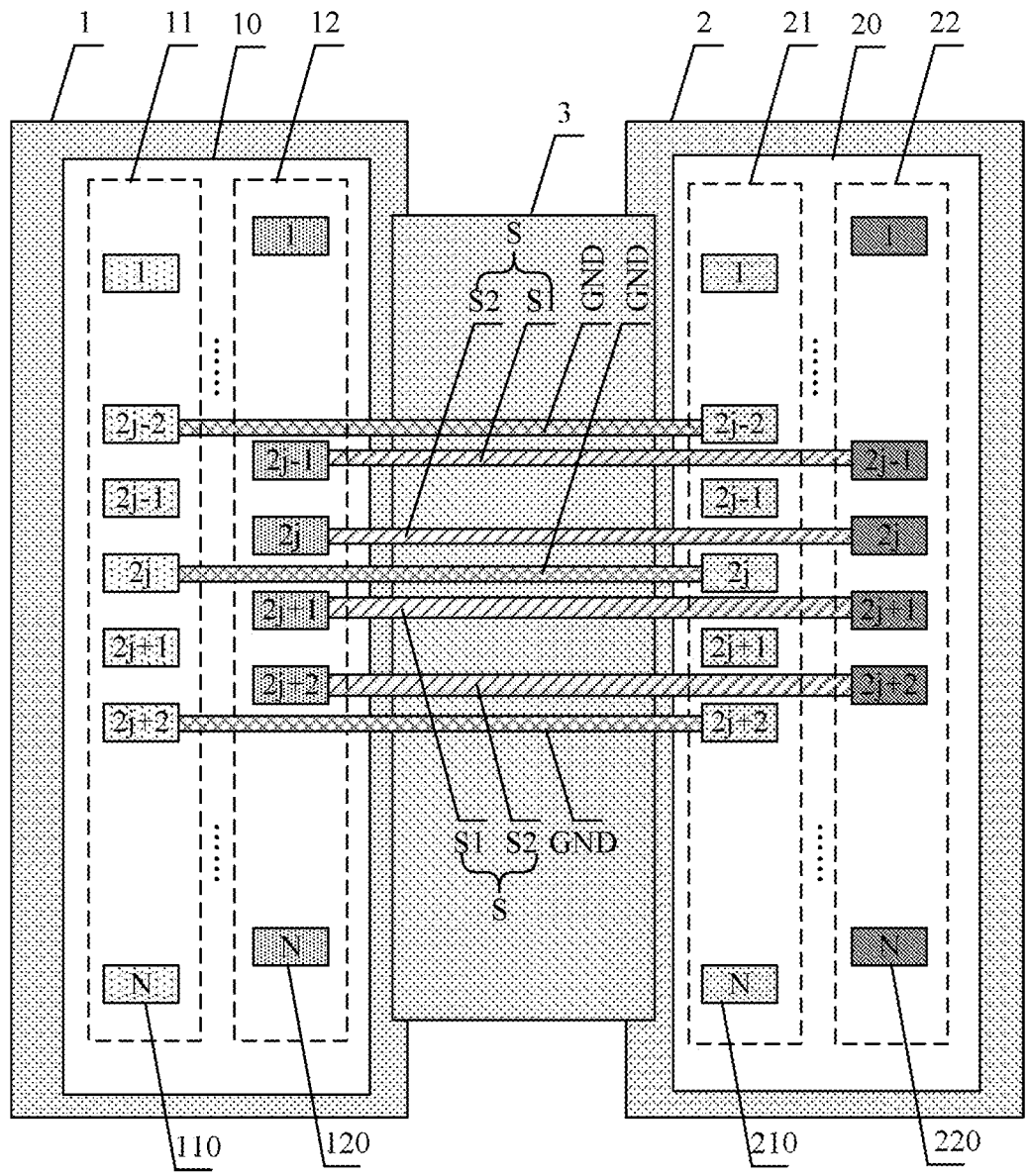
FIG. 3 is a third schematic diagram of a circuit board assembly according to an embodiment of the present disclosure.
Figure 4:
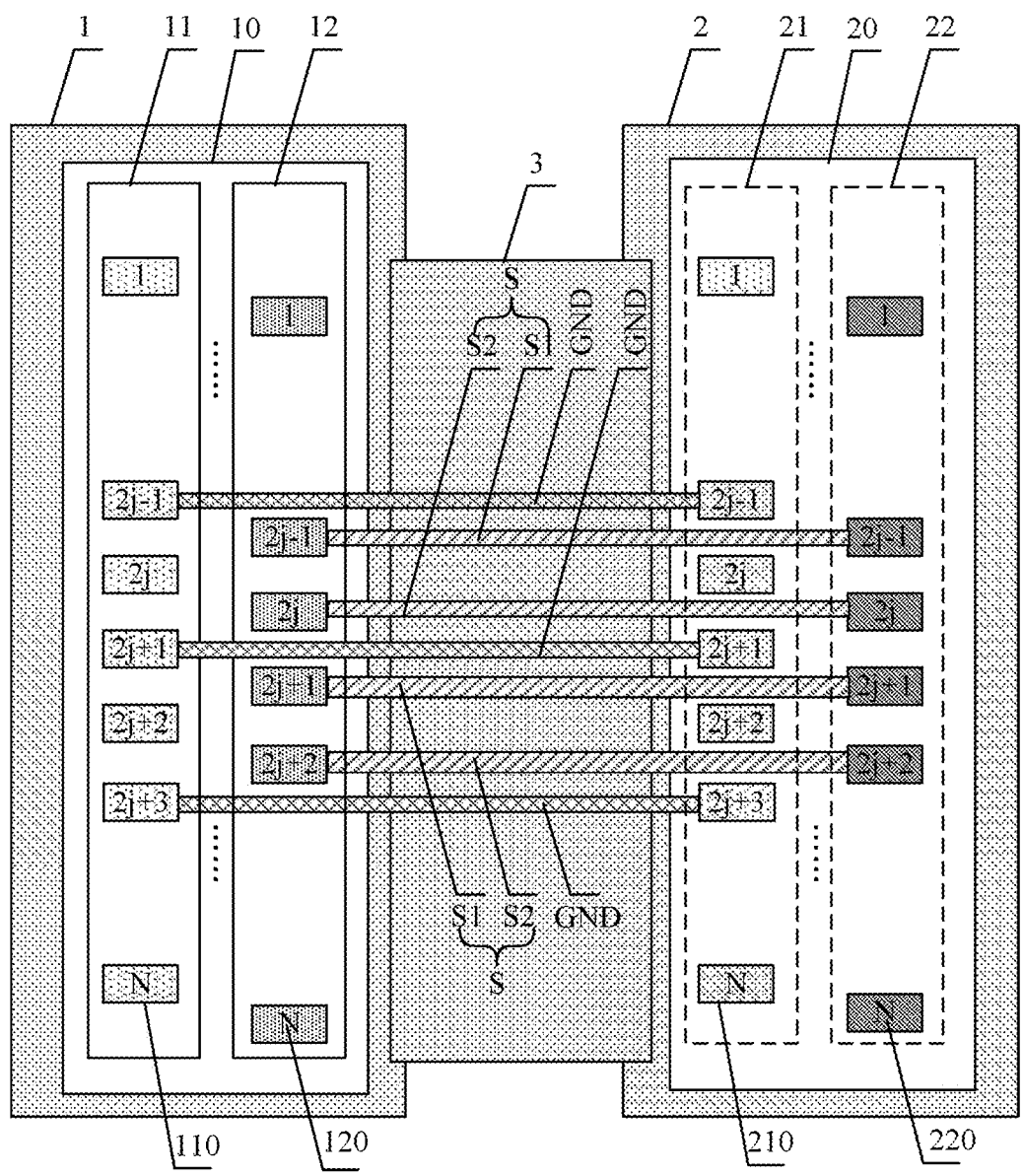
FIG. 4 is a fourth schematic diagram of a circuit board assembly according to an embodiment of the present disclosure.

FIG. 1 is a first schematic diagram of a circuit board assembly according to an embodiment of the present disclosure, FIG. 2 is a second schematic diagram of a circuit board assembly according to an embodiment of the present disclosure, FIG. 3 is a third schematic diagram of a circuit board assembly according to an embodiment of the present disclosure, and FIG. 4 is a fourth schematic diagram of a circuit board assembly according to an embodiment of the present disclosure. As shown in FIGS. 1 to 4, the circuit board assembly according to an embodiment of the present disclosure includes a first circuit board 1, a second circuit board 2, a third circuit board 3 and multiple differential signal lines S. The first circuit board 1 and the second circuit board 2 are located at two opposite sides of the third circuit board 3. Each differential signal line S includes a first differential line S1 and a second differential line S2.

The first circuit board 1 includes a first connector 10. The first connector 10 includes a first pin group 11 and a second pin group 12 arranged along a first direction. The first pin group 11 includes N first pins 110 arranged along the second direction, and the second pin group 12 includes N second pins 120 arranged along the second direction.

The second circuit board 2 includes a second connector 20. The second connector 20 includes a third pin group 21 and a fourth pin group 22 arranged along the first direction. The third pin group 21 includes N third pins 210 arranged along the second direction, and the fourth pin group includes N fourth pins 220 arranged along the second direction.

Multiple i-th pins correspond to multiple (i+2)-th pins one by one, the i-th pins and corresponding (i+2)-th pins are arranged along the first direction, and i is a positive integer smaller than or equal to 2. A first differential line S1 of a j-th differential signal line S is connected with a (2j−1)-th pin of the i-th pins and a (2j−1)-th pin of the (i+2)-th pins respectively, and a second differential line S2 of the j-th differential signal line S is connected with a 2j-th pin of the i-th pins and a 2j-th pin of the (i+2)-th pins respectively.

The first direction is an arrangement direction of the first circuit board 1 and the second circuit board 2, and the second direction is perpendicular to the first direction, $1 \leq j \leq N/2$.

The multiple i-th pins correspond to the multiple (i+2)-th pins one by one, the i-th pins and corresponding (i+2)-th pins are arranged along the first direction, and i is a positive integer smaller than or equal to 2, that is, multiple first pins correspond to multiple third pins one by one, the first pins and corresponding third pins are arranged along the first direction, multiple second pins correspond to multiple fourth pins one by one, and the second pins and corresponding fourth pins are arranged along the first direction.

In an exemplary embodiment, the first circuit board 1 and the second circuit board 2 may be printed circuit boards.

In the present disclosure, a first differential line and a second differential line of the same differential signal line are respectively connected with an adjacent i-th pin and a (i+2)-th pin corresponding to the adjacent i-th pin, so that the first differential line and the second differential line of the same differential signal line are parallel to each other without staggered arrangement, and a symmetrical arrangement of the first differential line and the second differential line of the same differential signal line can be ensured. Because a spacing between adjacent i-th pins is large, the widths of the first differential line and the second differential line can be adjusted, and the differential impedance can be controlled according to the specification of 100 ohm on the third circuit board.

The circuit board assembly according to an embodiment of the present disclosure includes: a first circuit board, a second circuit board, a third circuit board and multiple differential signal lines. The first circuit board and the second circuit board are respectively located at two opposite sides of the third circuit board. Each differential signal line includes a first differential line and a second differential line. The first circuit board includes a first connector including a first pin group and a second pin group arranged along a first direction. The first pin group includes N first pins arranged along a second direction, and the second pin group includes N second pins arranged along the second direction. The second circuit board includes a second connector including a third pin group and a fourth pin group arranged along the first direction. The third pin group includes N third pins arranged along the second direction, and the fourth pin group includes N fourth pins arranged along the second direction. Multiple i-th pins correspond to multiple (i+2)-th pins one by one, the i-th pins and corresponding (i+2)-th pins are arranged along the first direction, and i=1 or 2. A first differential line of a j-th differential signal line is connected with a (2j−1)-th pin of the i-th pins and a (2j−1)-th pin of the (i+2)-th pins respectively, and a second differential line of the j-th differential signal line is connected with a 2j-th pin of the i-th pins and a 2j-th pin of the (i+2)-th pins respectively. The first direction is an arrangement direction of the first circuit board and the second circuit board, and the second direction is perpendicular to the first direction, $1 \leq j \leq N/2$. According to the present disclosure, through a connection mode of the first differential line and the second differential line of the differential signal line, symmetrical arrangement and impedance control of the differential signal line may be achieved, and the display effect of the display product is improved.

In an exemplary embodiment, the first differential line S1 and the second differential line S2 of a same differential signal line S have opposite polarities, and have the equal width along the second direction.

In an exemplary embodiment, first differential lines in different differential signal lines have the equal or unequal width along the second direction, depending on the specifications of the circuit board assembly.

In an exemplary embodiment, the polarity of the first differential line may be positive, the polarity of the second differential line may be negative, or the polarity of the first differential line may be negative and the polarity of the second differential line may be positive.

In an exemplary embodiment, multiple first pins in the first pin group and multiple second pins in the second pin group are staggered. Since the multiple first pins in the first pin group correspond to the multiple third pins in the third pin group one by one, and the multiple second pins in the second pin group correspond to the multiple fourth pins in the fourth pin group one by one, the multiple second pins in the second pin group and the multiple fourth pins in the fourth pin group are staggered.

In an exemplary embodiment, as shown in FIG. 1 and FIG. 3, the multiple first pins in the first pin group and the multiple second pins in the second pin group may be staggered in such a way that a k-th pin of the first pins is located between a k-th pin of the second pins and a (k+1)-th pin of the second pins, an N-th pin of the second pins is located between an (N−1)-th pin of the first pins and an N-th pin of the first pins, and $1 \leq k \leq N-1$.

In an exemplary embodiment, as shown in FIG. 2 and FIG. 4, the multiple first pins in the first pin group and the multiple second pins in the second pin group can be staggered in such a way that a k-th pin of the second pins is located between a k-th pin of the first pins and a (k+1)-th pin of the first pins, and an N-th pin of the first pins is located between an (N−1)-th pin of the second pins and an N-th pin of the second pins; $1 \leq k \leq N-1$.

In an exemplary embodiment, as shown in FIGS. 1 to 4, the circuit board assembly further includes a ground line GND. The ground line GND is located between adjacent differential signal lines. The ground line GND between adjacent differential signal lines may avoid crosstalk between adjacent differential signal lines and improve the display effect of display products.

In an exemplary embodiment, as shown in FIG. 1, when the multiple first pins in the first pin group and the multiple second pins in the second pin group are staggered in a manner as in FIG. 1, when i=1, a first differential line S1 of a j-th differential signal line S is connected with a (2j−1)-th pin of the first pins and a (2j−1)-th pin of the third pins respectively; a second differential line S2 of the j-th differential signal line S is connected with a 2j-th pin of the first pins and a 2j-th pin of the third pins respectively. At this time, a ground line between the j-th differential signal line S and a (j+1)-th differential signal line S is connected with a (2j+1)-th pin of the second pins and a (2j+1)-th pin of the fourth pins.

In an exemplary embodiment, as shown in FIG. 1, no signal line or power supply line is connected between a 2j-th pin of the second pins and a 2j-th pin of the fourth pins, and a line width and line pitch of the first differential line and the second differential line of the j-th differential signal line may be adjusted to achieve control of the impedance of the differential signal line.

In an exemplary embodiment, as shown in FIG. 2, when the multiple first pins in the first pin group and the multiple second pins in the second pin group are staggered in a manner as in FIG. 2, when i=1, the first differential line S1 of the j-th differential signal line S is connected with a (2j−1)-th pin of the first pins and a (2j−1)-th pin of the third pins respectively, the second differential line S2 of the j-th differential signal line S is connected with a 2j-th pin of the first pins and a 2j-th pin of the third pins respectively. At this time, the ground line between the j-th differential signal line and the (j+1)-th differential signal line is connected with a 2j-th pin of the second pins and a 2j-th pin of the fourth pins.

In an exemplary embodiment, as shown in FIG. 2, no signal line or power supply line is connected between a (2j−1)-th pin of the second pins and a (2j−1)-th pin of the fourth pins, and the line width and line pitch of the first differential line and the second differential line of the j-th differential signal line may be adjusted to achieve control of the impedance of the differential signal line.

In an exemplary embodiment, as shown in FIG. 3, when the multiple first pins in the first pin group and the multiple second pins in the second pin group are staggered in a manner as in FIG. 3, when i=2, the first differential line S1 of the j-th differential signal line S is connected with a (2j−1)-th pin of the second pins and a (2j−1)-th pin of the fourth pins respectively, the second differential line S2 of the j-th differential signal line S is connected with a 2j-th pin of the second pins and a 2j-th pin of the fourth pins respectively. At this time, the ground line between the j-th differential signal line and the (j+1)-th differential signal line is connected with a 2j-th pin of the first pins and a 2j-th pin o the third pins.

In an exemplary embodiment, as shown in FIG. 3, no signal line or power supply line is connected between a (2j−1)-th pin of the first pins and a (2j−1)-th pin of the third pins, and the line width and line pitch of the first differential line and the second differential line of the j-th differential signal line may be adjusted to achieve control the impedance of the differential signal line.

In an exemplary embodiment, as shown in FIG. 4, when the multiple first pins in the first pin group and the multiple second pins in the second pin group are staggered in a manner as in FIG. 4, when i=2, the first differential line S1 of the j-th differential signal line S is connected with a (2j−1)-th pin of the second pins and a (2j−1)-th pin of the fourth pins respectively, the second differential line S2 of the j-th differential signal line S is connected with a 2j-th pin of the second pins and a 2j-th pin of the fourth pins respectively. At this time, the ground line between the j-th differential signal line and the (j+1)-th differential signal line is connected with a (2j+1)-th pin of the first pins and a (2j+1)-th pin of the third pins.

In an exemplary embodiment, as shown in FIG. 4, no signal line or power supply line is connected between a 2j-th pin of the first pins and a 2j-th pin of the third pins, and the line width and line pitch of the first differential line and the second differential line of the j-th differential signal line may be adjusted to achieve control of the impedance of the differential signal line.

The first connector and the second connector in the circuit board assembly include pins connected with differential signal lines, pins connected with ground lines, and pins not connected with any signal lines or power supply lines.

In an exemplary embodiment, as shown in FIGS. 1 to 4, a distance between the third circuit board 3 and the first connector 10 is greater than 0, and a distance between the third circuit board 3 and the second connector 20 is greater than 0.

Figure 5:
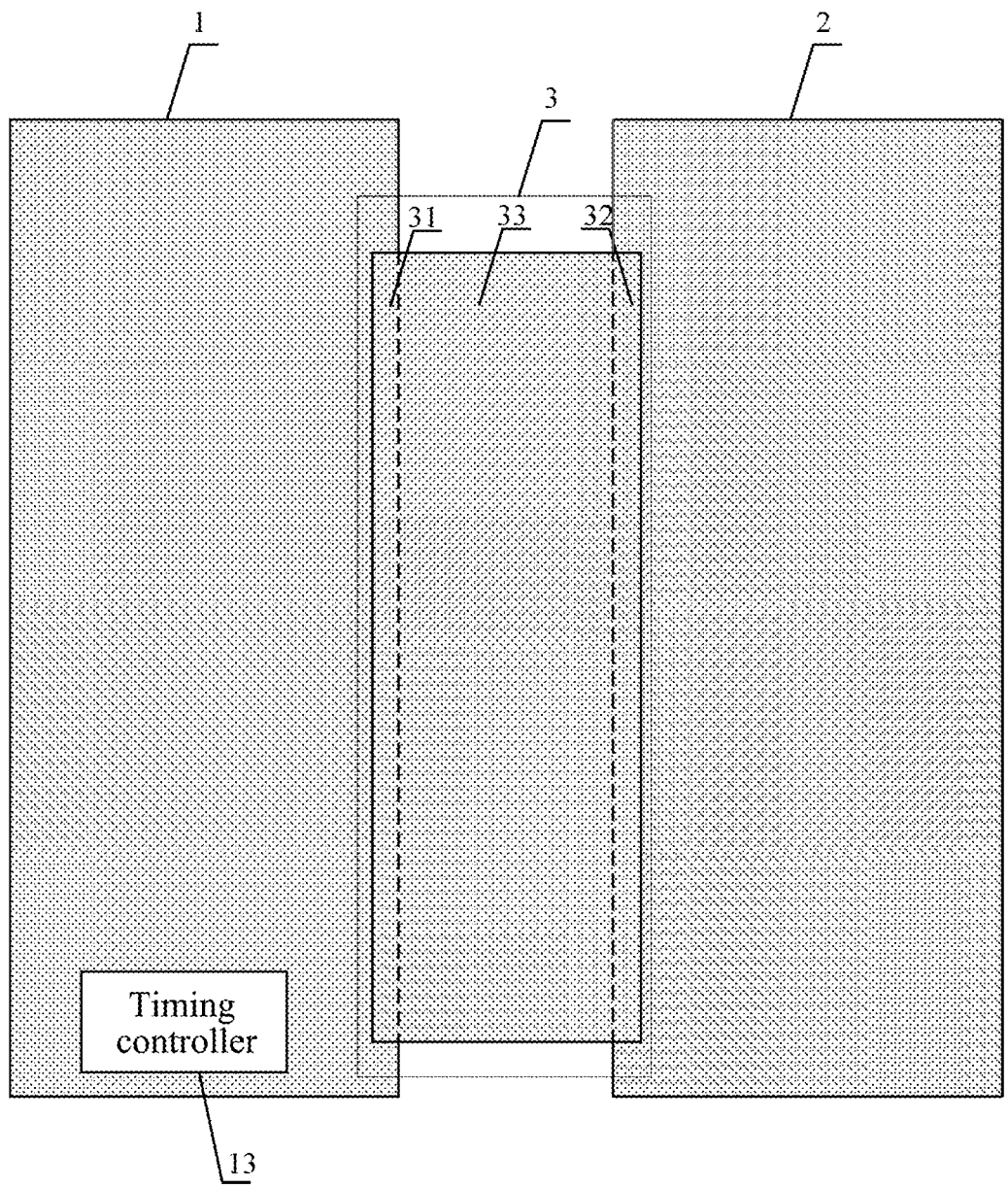
FIG. 5 is a schematic diagram of a structure of a circuit board assembly according to an exemplary embodiment.

FIG. 5 is a schematic diagram of a structure of a circuit board assembly according to an exemplary embodiment. As shown in FIG. 5, in an exemplary embodiment, a timing controller 13 is provided on the first circuit board 1 or the second circuit board 2. The timing controller 13 is connected with differential signal lines, and configured to convert a received display signal into a differential signal and send the differential signal to the differential signal lines.

In an exemplary embodiment, the differential signal is sent from the first circuit board to the second circuit board through the first connector, the third circuit board and the second connector.

In an exemplary embodiment, the timing controller may be provided on the first circuit board 1, or alternatively, may be provided on the second circuit board 2. FIG. 5 illustrates the timing controller provided on the first circuit board 1 as an example.

In an exemplary embodiment, a third circuit board is a flexible printed circuit board, and the third circuit board is a flexible printed circuit board which may achieve flexible display and has foldable performance.

In an exemplary embodiment, as shown in FIG. 5, the third circuit board 3 is divided into a first connection part 31, a circuit board body 33 and a second connection part 32 arranged along a first direction.

The first connecting part 31 is connected with the first circuit board 1, and the second connecting part 32 is connected with the second circuit board 2.

In an exemplary embodiment, the first connecting part 31 is pressed on the first circuit board 1 and the second connecting part 32 is pressed on the second circuit board 2.

Figure 6:
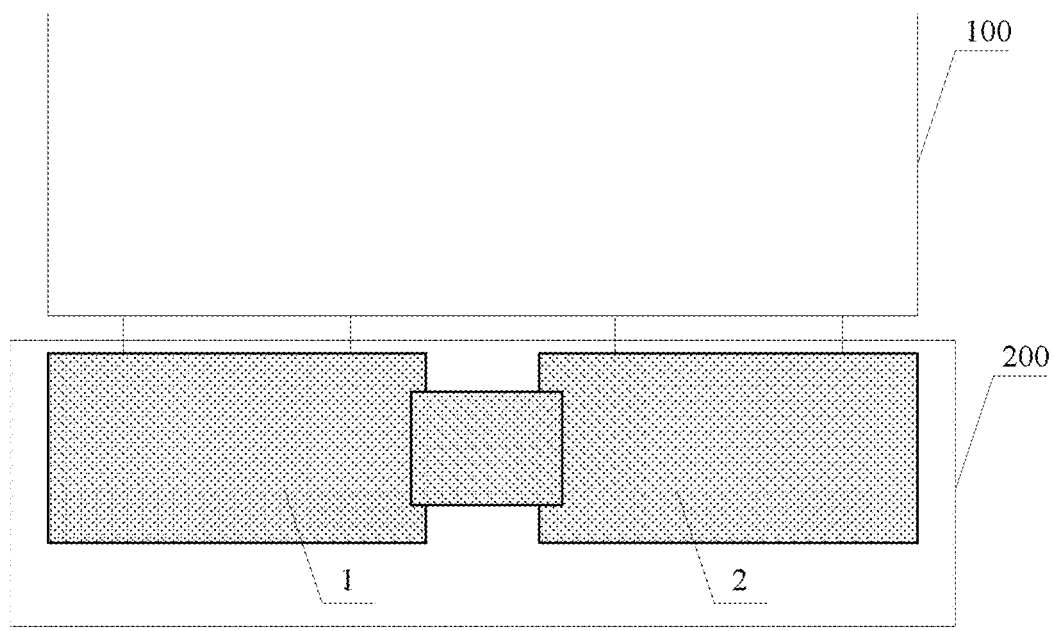
FIG. 6 is a schematic diagram of a structure of a display apparatus according to an embodiment of the present disclosure.

FIG. 6 is a schematic diagram of a structure of a display apparatus according to an embodiment of the present disclosure. As shown in FIG. 6, the display apparatus according to an embodiment of the present disclosure includes a display panel 100 and a circuit board assembly 200.

A first circuit board 1 and a second circuit board 2 in the circuit board assembly 200 are connected respectively with the display panel 100 by chip on film COF technology.

In an exemplary embodiment, the display panel may be an OLED display panel.

In an exemplary embodiment, the display apparatus may be any product or component with a display function such as a mobile phone, a tablet computer, a TV set, a display, a notebook computer, a digital photo frame, a navigator, etc.

The circuit board assembly is the circuit board assembly according to any of the foregoing embodiments, and the implementation principle and implementation effect thereof are similar, and will not be repeated here.

An embodiment of the present disclosure also provides a terminal, including: the display apparatus according to any of the foregoing embodiments.

The terminal includes the display apparatus according to any of the foregoing embodiments, and the implementation principle and implementation effect thereof are similar, and will not be repeated here.

Figure 7:
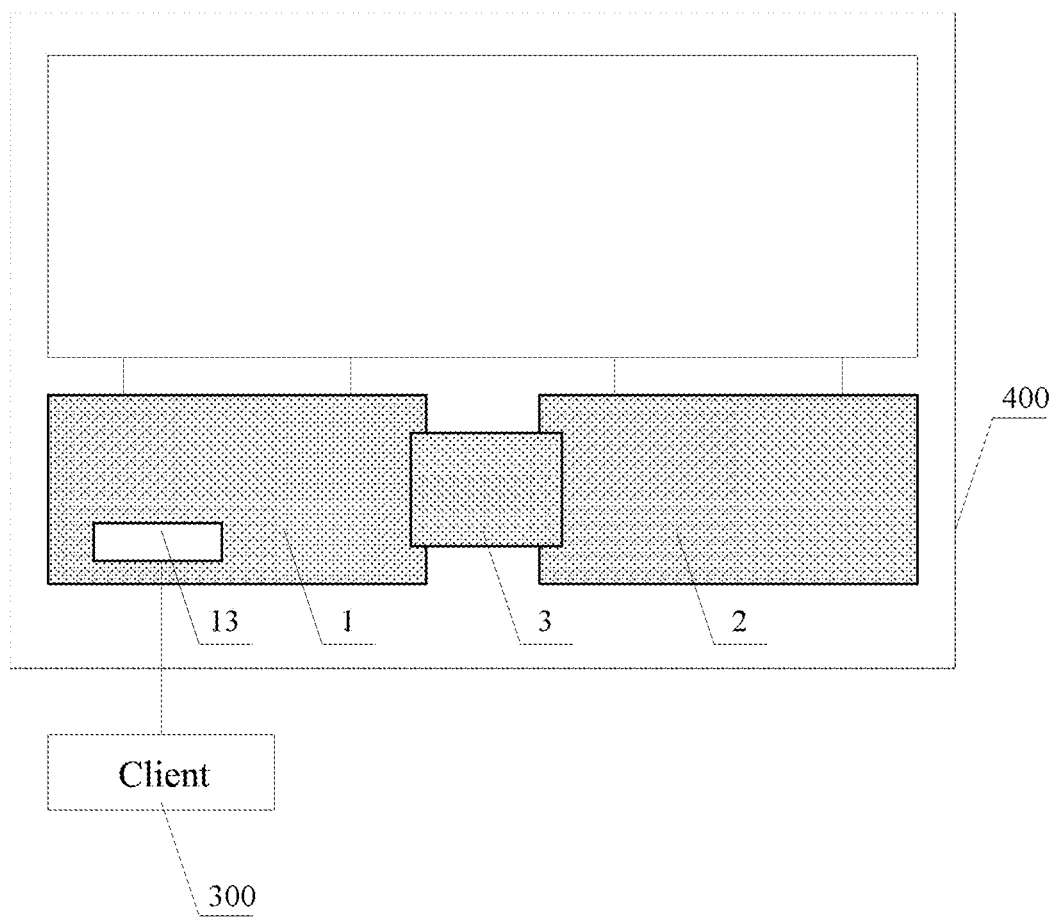
FIG. 7 is a schematic diagram of a structure of a signal processing system according to an embodiment of the present disclosure.

FIG. 7 is a schematic diagram of a structure of a signal processing system according to an embodiment of the present disclosure. As shown in FIG. 7, the signal processing system according to an embodiment of the present disclosure includes a client 300 and a terminal 400 according to any of the foregoing embodiments. The client 300 is configured to send a display signal to the terminal 400; the terminal 400 is configured to convert the display signal into a differential signal.

The signal processing system includes the terminal according to any of the foregoing embodiments, and the implementation principle and the implementation effect thereof are similar, and will not be repeated here.

In an exemplary embodiment, the terminal 300 includes a timing controller 13 provided on a circuit board assembly.

The timing controller 13 is connected with the client 400 and is configured to convert the display signal sent by the client into the differential signal.

The drawings in the present disclosure only involve the structures included in the embodiments of the present disclosure, and other structures may refer to common designs.

For clarity, the thickness and dimension of layers or micro-structures are magnified in the accompanying drawings used for describing the embodiments of the present disclosure. It can be understood that when an element, such as a layer, a film, an area or a substrate, is referred to as being located "above" or "below" another element, the element may be "directly" located "above" or "below" another element, or an intermediate element may exist.

Although the implementations of the present disclosure are disclosed above, the contents are only implementations adopted to easily understand the present disclosure but not intended to limit the present disclosure. Those skilled in the art may make any modifications and variations to implementation forms and details without departing from the spirit and scope disclosed by the present disclosure. However, the scope of patent protection of the present disclosure should also be subject to the scope defined by the appended claims.

The invention claimed is:

1. A circuit board assembly, comprising: a first circuit board; a second circuit board; a third circuit board; and a plurality of differential signal lines, wherein:
   the first circuit board and the second circuit board are located at two opposite sides of the third circuit board respectively; and each differential signal line comprises a first differential line and a second differential line;
   the first circuit board comprises: a first connector comprising a first pin group and a second pin group arranged along a first direction; the first pin group comprises N first pins arranged along a second direction, and the second pin group comprises N second pins arranged along the second direction, wherein N is an integer greater than 1;
   the second circuit board comprises: a second connector comprising a third pin group and a fourth pin group arranged along the first direction; the third pin group comprises N third pins arranged along the second direction, and the fourth pin group comprises N fourth pins arranged along the second direction;
   a plurality of i-th pins correspond to a plurality of (i+2)-th pins one by one, the i-th pins and corresponding (i+2)-th pins are arranged along the first direction, and i is a positive integer smaller than or equal to 2;
   a first differential line of a j-th differential signal line is connected with a (2j−1)-th pin of the i-th pins and a (2j−1)-th pin of the (i+2)-th pins respectively, and a second differential line of the j-th differential signal line is connected with a 2j-th pin of the i-th pins and a 2j-th pin of the (i+2)-th pins respectively; and
   the first direction is an arrangement direction of the first circuit board and the second circuit board, and the second direction is perpendicular to the first direction, $1 \leq j \leq N/2$.

2. The circuit board assembly according to claim 1, wherein the first differential line and the second differential line of the same differential signal line have opposite polarities and have an equal width along the second direction.

3. The circuit board assembly according to claim 1, wherein the circuit board assembly further comprises a ground line;
   the ground line is located between adjacent differential signal lines.

4. The circuit board assembly according to claim 3, wherein a k-th pin of the first pins is located between a k-th pin of the second pins and a (k+1)-th pin of the second pins, and an N-th pin of the second pins is located between an (N−1)-th pin of the first pins and an N-th pin of the first pins, $1 \leq k \leq N-1$.

5. The circuit board assembly according to claim 3, wherein a k-th pin of the second pins is located between a k-th pin of the first pins and a (k+1)-th pin of the first pins, and an N-th pin of the first pins is located between an (N−1)-th pin of the second pins and an N-th pin of the second pins; $1 \leq k \leq N-1$.

6. The circuit board assembly according to claim 4, wherein,
   when i=1, a ground line between the j-th differential signal line and a (j+1)-th differential signal line is connected with a (2j+1)-th pin of the second pins and a (2j+1)-th pin of the fourth pins; and
   when i=2, a ground line between the j-th differential signal line and the (j+1)-th differential signal line is connected with a 2j-th pin of the first pins and a 2j-th pin of the third pins.

7. The circuit board assembly according to claim 5, wherein
   when i=1, a ground line between the j-th differential signal line and a (j+1)-th differential signal line is connected with a 2j-th pin of the second pins and a 2j-th pin of the fourth pins; and
   when i=2, a ground line between the j-th differential signal line and the (j+1)-th differential signal line is connected with a (2j+1)-th pin of the first pins and a (2j+1)-th pin of the third pins.

8. The circuit board assembly according to claim 1, wherein the first circuit board or the second circuit board is provided with a timing controller;
   the timing controller is connected with the differential signal lines, configured to convert a received display signal into a differential signal and send the differential signal to the differential signal lines.

9. The circuit board assembly according to claim 1, wherein a distance between the third circuit board and the first connector is greater than 0, and a distance between the third circuit board and the second connector is greater than 0.

10. The circuit board assembly according to claim 1, wherein the third circuit board is a flexible printed circuit board;
the third circuit board is divided into a first connection part, a circuit board body and a second connection part which are arranged along the first direction; and
the first connecting part is connected with the first circuit board, and the second connecting part is connected with the second circuit board.

11. The circuit board assembly according to claim 10, wherein the first connecting part is pressed on the first circuit board and the second connecting part is pressed on the second circuit board.

12. A display apparatus, comprising: a display panel and the circuit board assembly according to claim 1;
the first circuit board and the second circuit board in the circuit board assembly are connected with the display panel respectively.

13. A terminal, comprising: the display apparatus according to claim 12.

14. A signal processing system, comprising: a client and the terminal according to claim 13;
the client is configured to send a display signal to the terminal; and
the terminal is configured to convert the display signal into a differential signal.

15. The system according to claim 14, wherein the terminal comprises: a timing controller provided on the circuit board assembly;
the timing controller is connected with the client and configured to convert the display signal sent by the client into the differential signal.

16. The circuit board assembly according to claim 2, wherein the circuit board assembly further comprises a ground line;
the ground line is located between adjacent differential signal lines.

17. The circuit board assembly according to claim 9, wherein the third circuit board is a flexible printed circuit board;
the third circuit board is divided into a first connection part, a circuit board body and a second connection part which are arranged along the first direction; and
the first connecting part is connected with the first circuit board, and the second connecting part is connected with the second circuit board.

18. The circuit board assembly according to claim 17, wherein the first connecting part is pressed on the first circuit board and the second connecting part is pressed on the second circuit board.

* * * * *